United States Patent
Sano et al.

(10) Patent No.: US 8,641,256 B2
(45) Date of Patent: Feb. 4, 2014

(54) SEMICONDUCTOR LIGHT EMITTING DEVICE, COMPOSITE LIGHT EMITTING DEVICE WITH ARRANGEMENT OF SEMICONDUCTOR LIGHT EMITTING DEVICES, AND PLANAR LIGHT SOURCE USING COMPOSITE LIGHT EMITTING DEVICE

(75) Inventors: Takeshi Sano, Saitama (JP); Kouji Tsukagoshi, Gunma (JP); Masanori Hoshino, Saitama (JP); Kazuyoshi Haga, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 351 days.

(21) Appl. No.: 12/741,664

(22) PCT Filed: Sep. 30, 2008

(86) PCT No.: PCT/JP2008/067704
§ 371 (c)(1),
(2), (4) Date: Feb. 24, 2011

(87) PCT Pub. No.: WO2009/060676
PCT Pub. Date: May 14, 2009

(65) Prior Publication Data
US 2011/0188266 A1     Aug. 4, 2011

(30) Foreign Application Priority Data
Nov. 6, 2007 (JP) ............... 2007-008595 U

(51) Int. Cl.
*F21V 9/16* (2006.01)
(52) U.S. Cl.
USPC ........................................ 362/613; 362/231
(58) Field of Classification Search
USPC .................. 362/613, 231, 249.02, 260
See application file for complete search history.

(56) References Cited

U.S. PATENT DOCUMENTS 6,577,073 B2   6/2003   Shimizu et al.
7,224,000 B2   5/2007   Aanegola et al.
(Continued)

FOREIGN PATENT DOCUMENTS

CN   1336693 A    2/2002
EP   1178544 A2   2/2002
(Continued)

OTHER PUBLICATIONS

PCT/JP2008/067704 International Search Report mailed on Oct. 28, 2008 (4 pages, including translation).
Taiwanese Office Action for Taiwanese Patent Application No. 097137450 mailed Oct. 23, 2012, 10 pages.

*Primary Examiner* — David V Bruce
(74) *Attorney, Agent, or Firm* — Wilmer Cutler Pickering Hale and Dorr LLP

(57) ABSTRACT

A semiconductor light emitting device includes a recess portion defined by a pair of opposing first side wall portions and a pair of opposing second side wall portions extending between the first side wall portions and shorter than the first side wall portions. Light emitting elements are arranged on the bottom surface of the recess portion in a direction of the first side wall portions. The light emitting elements include a first light emitting element for emitting light of a first color and a second light emitting element for emitting light of a second color different from the first color and placed closest to the second side wall portion among the light emitting elements. A resin portion containing a phosphor for wavelength-converting a part of the light of the second color into a complementary color of the light of the second color is filled into the recess portion.

9 Claims, 3 Drawing Sheets

(56) References Cited

U.S. PATENT DOCUMENTS

| | | | |
|---|---|---|---|
| 7,365,485 B2 | 4/2008 | Fukasawa et al. | |
| 7,455,423 B2 * | 11/2008 | Takenaka | 362/231 |
| 8,362,493 B2 * | 1/2013 | Sano et al. | 257/79 |
| 2002/0011601 A1 | 1/2002 | Furukawa et al. | |
| 2002/0050797 A1 | 5/2002 | Lechner | |
| 2003/0038596 A1 | 2/2003 | Ho | |
| 2003/0218228 A1 | 11/2003 | Furukawa et al. | |
| 2005/0189539 A1 | 9/2005 | Furukawa et al. | |
| 2005/0194609 A1 | 9/2005 | Furukawa et al. | |
| 2005/0236638 A1 | 10/2005 | Tsukagoshi | |
| 2007/0170416 A1 | 7/2007 | Tsukagoshi | |
| 2008/0151527 A1 * | 6/2008 | Ueno et al. | 362/84 |

FOREIGN PATENT DOCUMENTS

| | | |
|---|---|---|
| JP | H06-177430 A | 6/1994 |
| JP | 11-039917 A | 2/1999 |
| JP | 2000-275636 A | 10/2000 |
| JP | 2002-050797 A | 2/2002 |
| JP | 2002-057376 A | 2/2002 |
| JP | 2004-296882 A | 10/2004 |
| JP | 2005-123484 A | 5/2005 |
| JP | 2005-353507 A | 12/2005 |
| JP | 2005353507 A * | 12/2005 |
| JP | 2007-200974 A | 8/2007 |
| JP | 2008-147189 A | 6/2008 |
| TW | 535303 B | 6/2003 |

* cited by examiner

SEMICONDUCTOR LIGHT EMITTING DEVICE, COMPOSITE LIGHT EMITTING DEVICE WITH ARRANGEMENT OF SEMICONDUCTOR LIGHT EMITTING DEVICES, AND PLANAR LIGHT SOURCE USING COMPOSITE LIGHT EMITTING DEVICE This application is a §371(c) national stage application of PCT/JP2008/067704, filed Sep. 30, 2008, which claims priority from JP Application No. 2007-008595, filed Nov. 6, 2007, the disclosure of each of which are incorporated by reference herein in their entirety.

TECHNICAL FIELD

This invention relates to a semiconductor light emitting device used as a light source for lighting or backlight of a liquid crystal display, a composite light emitting device with arrangement of the semiconductor light emitting devices, and a planar light source using the composite light emitting device.

BACKGROUND ART

A conventional semiconductor light emitting device of surface mount type uses a semiconductor light emitting element for emitting blue light and a semiconductor light emitting element for emitting red light in combination so as to emit white-based light. Such a semiconductor light emitting device is disclosed in FIG. 4, etc., of Patent Document 1 listed below. In the semiconductor light emitting device disclosed in FIG. 4 of Patent Document 1, from the top view, a light emitting diode chip for emitting red light is placed at the center of a rectangular substrate and light emitting diode chips for emitting blue light are placed closer to vertexes of the rectangular substrate so as to surround the light emitting diode chip for emitting red light. Further, the surrounding of the light emitting diode chip for emitting red light is once sealed with a translucent resin with a dispersing material, and then sealing is made with a resin containing a YAG phosphor so as to cover the top of the translucent resin and the top of the light emitting diode chips for emitting blue light. Accordingly, light emitted from the light emitting diode chip for emitting red light disperses in various directions in the translucent resin and a part of light emitted from the light emitting diode chips for emitting blue light is excited to yellow light with the resin containing the YAG phosphor. Consequently, red light, blue light, and yellow light are appropriately mixed and color rendering of white is good and a reddish point-like tint just above the light emitting diode chip for emitting red light can be prevented.
Patent Document 1: JP-A-2005-123484 (FIG. 4)

DISCLOSURE OF THE INVENTION

Problems to be Solved by the Invention

In the semiconductor light emitting device in Patent Document 1 and a planar light source device using the semiconductor light emitting device, the following problems occur.

In the semiconductor light emitting device in Patent Document 1, only the surrounding of the light emitting diode chip for emitting red light is once sealed with a translucent resin with a dispersing material, and then sealing is made with the YAG phosphor. Therefore, the manufacturing process becomes complicated.

In the semiconductor light emitting device in Patent Document 1, two or three light emitting diode chips are placed in the short direction of the semiconductor light emitting device in plan view. To use such a semiconductor light emitting device as a light source of a light guide plate system, the short direction of the semiconductor light emitting device (the thickness direction of the light guide plate) becomes long, the planar light source is thick, and the cost of the planar light source increases.

An object of the invention is to provide a semiconductor light emitting device, a composite light emitting device with arrangement of the semiconductor light emitting devices, and a planar light source using the composite light emitting device, which can solve the technical problems.

Means for Solving the Problems

According to a first aspect of the invention, there is provided a semiconductor light emitting device comprising: a base portion comprising a recess portion that is defined by a pair of opposing first side wall portions, a pair of opposing second side wall portions which extend between the first side wall portions when viewed from above and which are shorter than the first side wall portions, and a bottom surface; a plurality of light emitting elements which are arranged on the bottom surface of the recess portion in a direction of the first side wall portions when viewed from above and which comprise a first light emitting element for emitting light of a first color and a second light emitting element for emitting light of a second color different from the first color, the second light emitting element being placed closest to the second side wall portion among the plurality of light emitting elements; and a resin portion which is filled into the recess portion so as to cover the first and second light emitting elements and which contains a phosphor for wavelength-converting a part of the light of the second color into a complementary color of the light of the second color so as to emit the wavelength-converted light to an outside.

According to a second aspect of the invention, there is provided a composite light emitting device comprising: a plurality of semiconductor light emitting devices, each of which comprises: a base portion comprising a recess portion that is defined by a pair of opposing first side wall portions, a pair of opposing second side wall portions which extend between the first side wall portions when viewed from above and which are shorter than the first side wall portions, and a bottom surface; a plurality of light emitting elements which are arranged on the bottom surface of the recess portion in a direction of the first side wall portions when viewed from above and which comprise a first light emitting element for emitting light of a first color and a second light emitting element for emitting light of a second color different from the first color, the second light emitting element being placed closest to the second side wall portion among the plurality of light emitting elements; and a resin portion which is filled into the recess portion so as to cover the first and second light emitting elements and which contains a phosphor for wavelength-converting a part of the light of the second color into a complementary color of the light of the second color so as to emit the wavelength-converted light to an outside, wherein the plurality of semiconductor light emitting devices are arranged in the direction of the first side wall portion.

According to a second aspect of the invention, there is provided a planar light source of a light guide plate system comprising: a composite light emitting device comprising a plurality of semiconductor light emitting devices, each of which comprises: a base portion comprising a recess portion that is defined by a pair of opposing first side wall portions, a pair of opposing second side wall portions which extend between the first side wall portions when viewed from above and which are shorter than the first side wall portions, and a bottom surface; a plurality of light emitting elements which are arranged on the bottom surface of the recess portion in a direction of the first side wall portions when viewed from above and which comprise a first light emitting element for emitting light of a first color and a second light emitting element for emitting light of a second color different from the first color, the second light emitting element being placed closest to the second side wall portion among the plurality of light emitting elements; and a resin portion which is filled into the recess portion so as to cover the first and second light emitting elements and which contains a phosphor for wavelength-converting a part of the light of the second color into a complementary color of the light of the second color so as to emit the wavelength-converted light to an outside, wherein the plurality of semiconductor light emitting devices are arranged in the direction of the first side wall portion, wherein a longitudinal direction of the composite light emitting device is along a longitudinal direction of a light incident surface of a light guide plate, and wherein the light incident surface of the light guide plate is placed so as to oppose the bottom surface of the recess portion.

Advantages of the Invention

According to the semiconductor light emitting device of the first aspect of the invention, the semiconductor light emitting device with good color rendering of white-based color in the direction of the first side wall portion and easily manufactured can be provided. By using the semiconductor light emitting devices of the first aspect of the invention in a composite light emitting device with the semiconductor light emitting devices arranged in the direction of the first side wall portion, even in a planar light source of a light guide plate system, there can be provided a planar light source in which color unevenness in the longitudinal direction of the light incident surface of the light guide plate (on the side of the second side wall portion of the semiconductor light emitting device) is comparatively suppressed, the thickness is thin, and the manufacturing cost can be reduced.

DESCRIPTION OF REFERENCE NUMERALS

Figure 1:
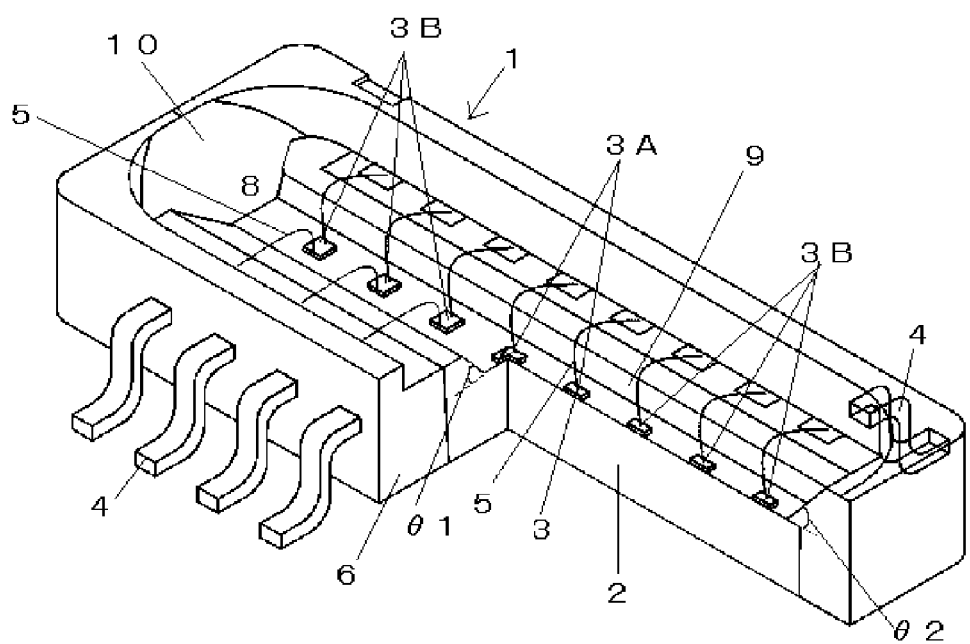
FIG. 1 is a perspective view to show a semiconductor light emitting device according to an embodiment of the invention.

1 Semiconductor light emitting device
2 Support plate
3 Light emitting diode chip
4 Lead terminal
5 Wire
6 Outer Surrounding Body
7 Base portion
8 Recess portion
9 First side wall portion
10 Second side wall portion
11 Resin portion

BEST MODE FOR CARRYING OUT THE INVENTION

A semiconductor light emitting device 1, a composite light emitting device 100, and a planar light source according to an embodiment of the invention will be described below.

As shown in FIG. 1, the semiconductor light emitting device 1 of the embodiment includes a support plate 2 containing a metal material as a major component, light emitting diode chips 3 as light emitting elements fixed to a top surface of the support plate 2, lead terminals 4 placed adjacent to a side surface of the support plate 2 and extending from a support plate side toward an outside, wires 5 each for electrically connecting a top electrode of the light emitting diode chip 3 and the corresponding lead terminal, an outer surrounding body 6 covering the side surface of the support plate 2 and parts of the lead terminals, and a resin portion 11.

In the semiconductor light emitting device of the embodiment, two first light emitting diode chips 3A for emitting red light (wavelength from about 620 nm to about 780 nm) and sets of three second light emitting diode chips 3B for emitting blue light (wavelength from about 450 nm to about 490 nm) are arranged in a line and are fixed to the top surface of the support plate 2 such that the sets of three second light emitting diode chips 3B sandwich the first light emitting diode chips 3A from an outer side of the first light emitting diode chips 3A (the side of a second side wall portion 10). Further, the semiconductor light emitting device includes 16 lead terminals 4 for electrically connecting anode electrodes and cathode electrodes of the light emitting diode chips 3. The support plate 2 and the outer surrounding body 6 constitute a base section 7 based on the embodiment.

It is preferable that the support plate 2 and the lead terminals 4 are formed of metal with high thermal conductivity, for example, copper, aluminum, a copper alloy, an aluminum alloy, etc. As shown in FIG. 1, the support plate 2 is shaped substantially rectangular parallelepiped having a pair of first side surfaces opposing each other, second side surfaces formed extending between the pair of first side surfaces, a top surface connected to the pair of first side surfaces and the pair of second side surfaces, and a lower surface connected to the pair of first side surfaces and the pair of second side surfaces and opposing the top surface. A length of the second side surface is shorter than a length of the first side surface in the direction along the top surface and the lower surface. That is, the top surface is shaped substantially rectangle in which sides as boundaries with the first side surfaces become long sides and in which sides as boundaries with the second side surfaces become short sides. In the embodiment, the long side direction of the top surface is referred to as the first direction, the short side direction of the top surface is referred to as the second direction, and the direction perpendicular to the first direction and the second direction is referred to as the height direction. In the height direction, the direction from the lower surface to the top surface is referred to as upward direction, and the direction from the top surface to the lower surface is referred to as downward direction.

The support plate 2 has a groove-shaped recess portion 8 formed on the top surface thereof, and the recess portion 8 has a depth larger than the height of the light emitting diode chip 3 (the total of the height of the light emitting diode chip 3 and the height of the base thereof). The recess portion 8 passes through the substantially center with respect to the second direction of the top surface of the support plate 2 and is formed substantially in parallel with the longitudinal direction (first direction) of the support plate 2 so as to reach the opposing second side surfaces of the support plate 2. The pair of first side surfaces of the support plate 2 projects upward from the bottom surface of the recess portion, and a portion connecting the top surface of the support plate 2 (namely, the portion of the top surface where the recess portion 8 is not formed) connected to the top end of the first side surface and the bottom surface of the recess portion 8 forms a first side wall portion 9. The first side wall portion 9 is inclined such that a distance between of a pair of first side wall portions 9 with respect to the second direction increases toward the direction away from the bottom surface of the recess portion (i.e., upward). Preferably, an angle of the inclination is set to an angle at which reflection light of light emitted from the light emitting diode chip 3 and reflected by the first side wall portion 9 can be efficiently taken out to the outside. Further, the angle of the inclination is preferably set so that the length of the semiconductor light emitting device 1 with respect to the second direction falls within any desired length. As shown in FIG. 1, an angle θ1 between the bottom surface of the recess portion 8 and the first side wall portion 9 is preferably not less than 30 degrees but not more than 60 degrees, and more preferably the angle is about 52 degrees. The lower surface of the support plate 2 is exposed to the outside from the lower surface of the outer surrounding body 6, whereby heat generated by the first and second light emitting diode chips 3 can be well released to the outside. One end of the lead terminal 4 is electrically connected to the anode electrode or the cathode electrode of each of the first and second light emitting diode chips 3 through the wire 5, etc., and an opposite end is derived to the outside from the outer surrounding body 6. In the semiconductor light emitting device 1, wiring may be performed so that a plurality of light emitting diode chips 3 are previously connected in series. In this case, the lead terminals 4 need not be provided corresponding to the anode electrode or the cathode electrode of the light emitting diode chips 3.

The first and second light emitting diode chips 3 are fixed to the bottom surface of the recess portion 8 of the support plate 2 in the direction of the first side wall portion 9 (the longitudinal direction of the support plate 2, the first direction). Each of the first light emitting diode chips 3A is a light emitting diode chip of InAlGaP for emitting red light, and each of the second light emitting diode chips 3B is a light emitting diode chip of a nitride-based semiconductor for emitting blue light. In the semiconductor light emitting device 1 of the embodiment of the invention, from the top view, the second light emitting diode chips 3B are provided as outermost ones (closest to the second side wall portion 10) of the light emitting diode chips 3 provided substantially in parallel in the direction of the first side wall portion 9 (the first direction) containing the first light emitting diode chips 3A. For example, in FIG. 1, eight light emitting diode chips 3 are arranged in a line, and in the figure, the fourth and fifth light emitting diode chips from the right are the first light emitting diode chips 3A and the remaining light emitting diode chips are the second light emitting diode chips 3B. However, the arrangement is not limited to that in FIG. 1, and the second and seventh light emitting diode chips from the right in the figure may be the first light emitting diode chips 3A and the remaining light emitting diode chips may be the second light emitting diode chips 3B, or only the fifth center light emitting diode chip may be the first light emitting diode chip 3A and the remaining light emitting diode chips may be the second light emitting diode chips 3B. The second light emitting diode chip 3B is for emitting light of wavelength where light emitted from the resin portion 11 becomes white-based color, and is not limited to a light emitting diode chip for emitting blue light. The first light emitting diode chip 3A is for emitting light to enhance the color rendering property of white-based light and is not limited to a light emitting diode chip for emitting red light. A light emitting diode chip for emitting light of a different color from the first and second light emitting diode chips 3A, 3B may be contained in the line of the light emitting diode chips. For example, a light emitting diode chip for emitting green light may be contained. Using a light emitting diode chip for emitting green light, drop of the spectrum between blue and green is complemented and color rendering of white can be improved. However, also in this case, providing the light emitting diode chip 3A for emitting blue light is preferably in an end portion.

The outer surrounding body 6 is formed of a resin having a comparatively large content of a compound (filling material) of silica, etc., containing a light reflective filler, for example, and has a white-based resin, for example. The outer surrounding body 6 has four outer side surfaces extending upward from the top surface of the support plate 2. The inner side surface of the outer surrounding body 6 provided on the second side surface of the support plate 2 projects upward from the top end of the second side surface of the support plate 2 and forms the second side wall portion 10. The second side wall portion 10 is also inclined relative to the bottom surface of the recess portion 8 such that a distance between a pair of second side wall portions 10 with respect to the second direction increases toward upward from the bottom surface of the recess portion 8. Preferably, an angle θ2 between the bottom surface of the recess portion 8 and the second side wall portion 10 is set to an angle to such an extent that any desired thickness of the side wall of the outer surrounding body 6 forming the second side wall portion 10 is ensured while the height of the outer surrounding body 6 satisfies any desired height, for example, θ2 is about 45 degrees. Therefore, in plan view, the first side wall portion 9 is longer than the second side wall portion 10, the first side wall portion 9 and the second side wall portion 10 surround the first and second light emitting diode chips 3 (the light emitting diode chips 3 placed substantially in a line along the first direction), and the first and second light emitting diode chips 3 are formed on the bottom surface of the recess portion 8 of the support plate 2 (the top surface of the support plate 2) formed by the first side wall portion 9 and the second side wall portion 10. To more increase light that is reflected on the first side wall portion 9 and can be taken out to the outside from the light emitting diode chip 3, a reflectance of the surface of the first side wall portion 9 is made high. On the other hand, in the second side wall portion 10, considering that a plurality of semiconductor light emitting devices 1 are arranged in a line in the direction of the first side wall portion 9 (first direction) for use, light can also be taken out to the outside from the second side wall portion 10 and at the same time, it is necessary to a ratio of light reflected on the second side wall portion 10 to light emitted from the first light emitting diode chip 3A and suppress a reddish tint (color unevenness) on the periphery of the second side wall portion 10. Therefore, surface materials (particularly, materials of the surfaces) of the first side wall portion 9 and the second side wall portion 10 may be formed so as to become different. For example, the surface of the first side wall portion 9 is made of silver (or a silver alloy) and the surface of the second side wall portion 10 is made of a white resin having smaller reflectance than the first side wall portion 9, so that the reflectance of the second side wall portion 10 becomes smaller than the a reflectance of the first side wall portion 9, and a reddish tint (color unevenness) on the periphery of the second side wall portion 10 may be suppressed.

The resin portion 11 having optical transparency is filled into the recess portion 8 formed by the first side wall portion 9 and the second side wall portion 10. The resin portion 11 covers the top surface of the support plate 2, the first and second light emitting diode chips 3, the wires 5, and the top surfaces of the lead terminals 4. The resin portion 11 contains a resin having high refractivity and optical transparency (for example, silicon resin) as a major component and covers the light emitting diode chips 3 and the wires 5. In the semiconductor light emitting device 1 of the embodiment, the resin portion 11 includes a first resin portion 11a and a second resin portion 11b. The first resin portion 11a contains a phosphor for performing wavelength conversion of a part of blue light emitted from the second light emitting diode chip 3B and emitting light of yellow (wavelength from about 580 nm to about 600 nm) which becomes a complementary color. The first resin portion 11a is filled into the recess portion 8 and the top surface of the first resin portion 11a is positioned substantially on the same plane as the top surface of the recess portion 8 (a surface in the top surface of the support plate 2 but where the recess portion 8 is not formed). The second resin portion 11b contains a scattering material for passing through red light emitted from the first light emitting diode chip 3A while scattering the red light. The second resin portion 11b is filled into the area surrounded by the outer surrounding body 6 so as to cover the top surface of the support plate 2 and the top surface of the first resin portion 11a. As the phosphor, a YAG-based, TAG-based, or silicate-based phosphor may be used, for example. As an example of the scattering material, silica or titanium oxide can be taken. Therefore, from the resin portion 11, light provided by mixing light emitted from the first and second light emitting diode chips 3 and light subjected to wavelength conversion by the resin portion 11 (for example, white light) can be emitted from the semiconductor light emitting device 1. In the Description, the light of a complementary color is light of color which can form a white-based color by mixing it with light of one or more colors. The first resin portion 11a may contain a scattering material in addition to the phosphor. The second resin portion 11b may also contain a phosphor.

In the semiconductor light emitting device 1 of the embodiment, in the first and second light emitting diode chips 3 placed in the longitudinal direction (first direction), the second light emitting diode chip 3B is placed on the side of the second side wall portion 10 from the first light emitting diode chip 3A. That is, the path until red light emitted from the first light emitting diode chip 3A arrives at the side of the second side wall portion 10 is made long. Therefore, the red light emitted from the first light emitting diode chip 3A is more easily scattered in the resin portion 11 until it arrives at the side of the second side wall portion 10.

For example, if the first light emitting diode chip 3A is placed closer to the second side wall portion 10 than the second light emitting diode chip 3B, on the side of the second side wall portion 10, the second light emitting diode chip 3B interfering with the first light emitting diode chip 3A does not exist on the outside in the longitudinal direction (first direction) and thus a reddish tint occurs on the periphery of the second side wall portion 10. However, according to the embodiment of the invention, the second light emitting diode chip 3B exists on the outside (the side of the second side wall portion 10) from the first light emitting diode chip 3A in the longitudinal direction of the semiconductor light emitting device, the first light emitting diode chip 3A and the second light emitting diode chip 3B also interfere with each other on the periphery of the second side wall portion 10, and occurrence of a reddish tint on the periphery of the second side wall portion 10 can be suppressed.

Generally, the second light emitting diode chip 3B uses a transparent substrate of sapphire, SiC, etc., and the first light emitting diode chip 3A is formed on a black opaque base (substrate) of gallium arsenide, silicon, etc. Thus, if the first light emitting diode chip 3A is placed closer to the second side wall portion 10 than the second light emitting diode chip 3B, the intensity of the light is attenuated in the resin portion 11 until arrival at the second side wall portion 10, and in addition, light emitted from the second light emitting diode chip 3B is also blocked by the base of the first light emitting diode chip 3A, consequently, blue light is hard to arrive at the side of the second side wall portion 10. However, according to the embodiment of the invention, the second light emitting diode chip 3B exists on the outside of the first light emitting diode chip 3A (on the side of the second side wall portion 10) in the longitudinal direction of the semiconductor light emitting device and such a problem does not occur.

A part of blue light emitted from the second light emitting diode chip 3B is excited and is converted into yellow light and becomes white-base light. Therefore, even if the second light emitting diode chip 3B is formed on the side of the second side wall portion 10 from the first light emitting diode chip 3A, the effect on a tint is small.

Light just above the first light emitting diode chip 3A and toward the side of the first side wall portion 9 interferes with the adjacent second light emitting diode chip 3B and the effect on a tint is small.

The reflectance of the surface of the first side wall portion 9 is made larger than the reflectance of the surface of the second side wall portion 10. Accordingly, tint in the longitudinal direction is suppressed, and light reflected on the first side wall portion 9 is more taken out in the direction just above the semiconductor light emitting device 1 (opening portion of the recess portion 8) and the light taking-out efficiency as a planar light source can be enhanced.

As described above, according to the embodiment of the invention, color rendering of white is good, and occurrence of a reddish tint caused by the light emitting diode chip for emitting red light on the periphery of the second side wall portion 10 of the semiconductor light emitting device can be prevented. Particularly, when a plurality of semiconductor light emitting devices are arranged in the longitudinal direction, a reddish tint in the surrounding of the second side wall portion 10 of the semiconductor light emitting device can be suppressed. Particularly, the semiconductor light emitting device with no color unevenness in the longitudinal direction of the semiconductor light emitting device can be provided.

Figure 2:
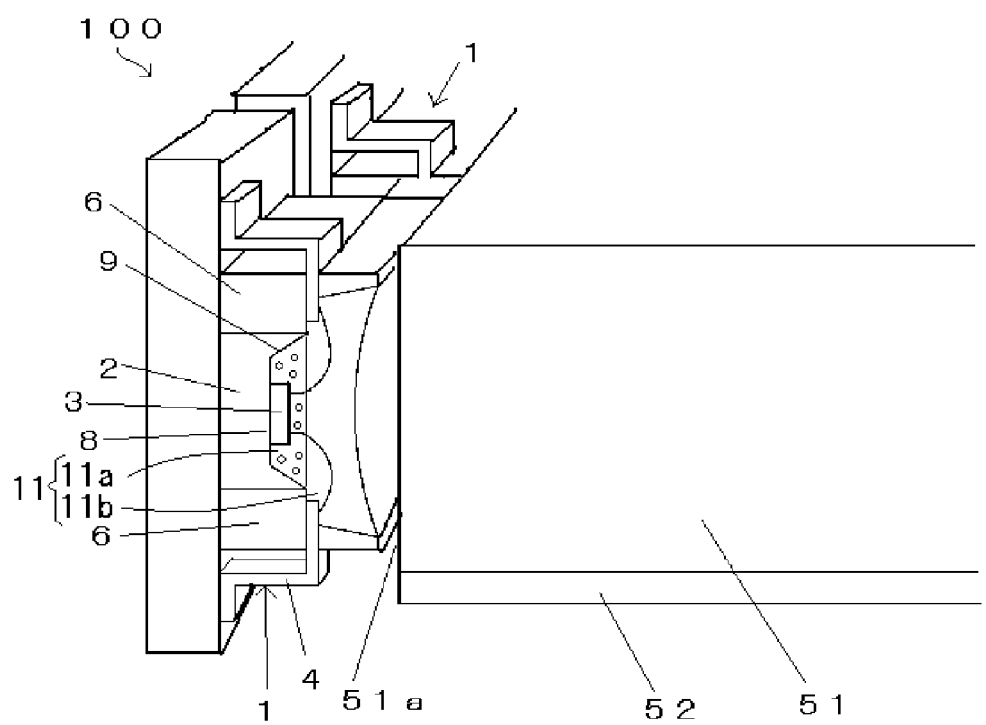
FIG. 2 is a sectional view to show a planar light source according to the embodiment of the invention.
Figure 3:
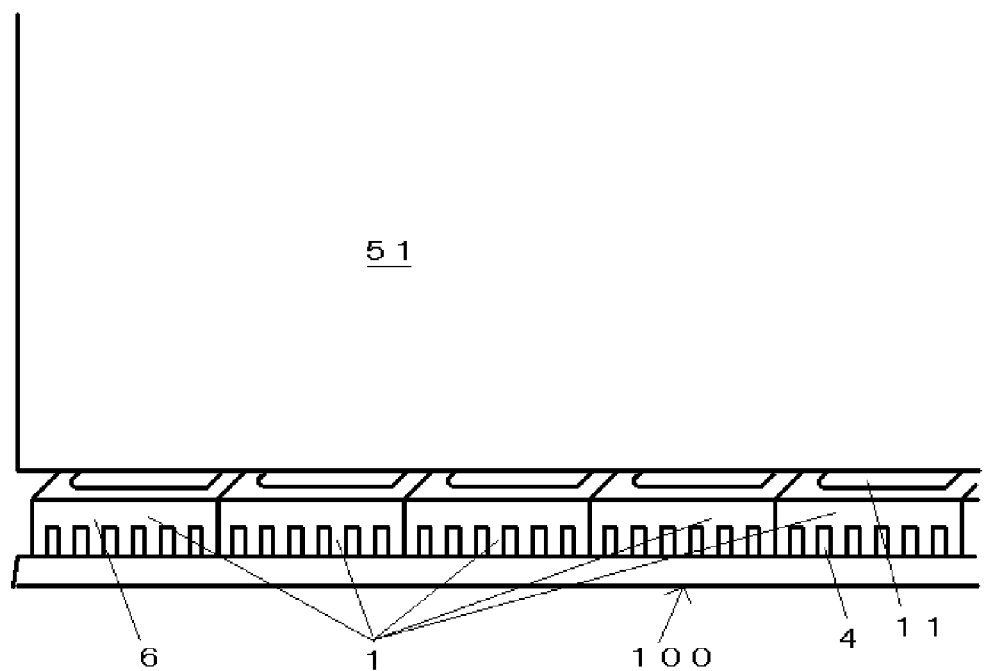
FIG. 3 is a sectional view to show the planar light source according to the embodiment of the invention.

FIGS. 2 and 3 are drawings to show the composite light emitting device 100 of the embodiment, and illustrate a planar light source used with a light emitting device of a light guide plate system as an example. The composite light emitting device 100 includes a plurality of semiconductor light emitting devices 1, and the semiconductor light emitting devices 1 are arranged along the longitudinal direction of the semiconductor light emitting devices 1 (i.e., the first direction). As shown in FIGS. 2 and 3, even in a planar light source placed so as to oppose the longitudinal direction of a light incident surface 51a of a light guide plate 51 placed on a light reflection plate 52, a light tint in the longitudinal direction of the light incident surface 51a incident on the light guide plate 51 is improved, and tint of light emitted from the light guide plate 51 can be improved.

For example, it is very difficult to manufacture a planar light source more than the longitudinal direction of the light guide plate and a plurality of semiconductor light emitting devices 1 are arranged as shown in FIG. 2, thereby forming the composite light emitting device 100. On the other hand, the resin portion 11 of the semiconductor light emitting device 1 has softness and thus needs to be surrounded by a base portion 7. Therefore, the second side wall portion 10 exists between the resin portion 11 of the planar light source and the resin portion of the adjacent planar light source in the longitudinal direction of the planar light source.

It is desired that the light guide plate 51 is thinned from the viewpoints of the manufacturing cost and the reduction in the thickness. In association therewith, it is also desired that the width of the planar light source is narrowed, which limits the number of light emitting diode chips 3 that can be arranged in the width (in FIG. 2, longitudinal) direction of the planar light source, and only one line of light emitting diode chips 3 as shown in FIG. 1 can be placed. In the planar light source, if color unevenness of light in the longitudinal direction occurs, color unevenness in the longitudinal direction emitted from the light guide plate 51 (namely, color unevenness of display surface) becomes a problem.

According to the planar light source in which the semiconductor light emitting devices 1 are arranged as shown in FIGS. 2 and 3, the semiconductor light emitting devices 1 with no color unevenness in the longitudinal direction of the semiconductor light emitting devices 1 are placed in the longitudinal direction of the semiconductor light emitting devices 1, so that the planar light source can be easily manufactured and the planar light source that can suppress color unevenness in the longitudinal direction emitted from the light guide plate 51 can be provided. Further, if the light emitting diode chips 3 are placed in only one line, color unevenness in the longitudinal direction can be suppressed, so that the narrow planar light source with color unevenness in the longitudinal direction suppressed can be provided. Particularly, in FIG. 1, the angle θ1 between the bottom surface of the recess portion 8 and the first side wall portion 9 is set larger than the angle θ2 between the bottom surface of the recess portion 8 and the second side wall portion 10, whereby light does not spread in the second direction and color unevenness in the first direction (longitudinal direction) can be suppressed. Therefore, to use as the planar light source as in FIG. 2, light can be well taken into the light guide plate 51 and color unevenness of the light guide plate 51 can be well suppressed.

The invention claimed is:

1. A semiconductor light emitting device comprising:
a base portion comprising a recess portion that is defined by a pair of opposing first side wall portions, a pair of opposing second side wall portions which extend between the first side wall portions when viewed from above and which are shorter than the first side wall portions, and a bottom surface;
a plurality of light emitting elements which are arranged on the bottom surface of the recess portion in a direction of the first side wall portions when viewed from above and which comprise a first light emitting element for emitting light of a first color and a second light emitting element for emitting light of a second color different from the first color, the second light emitting element being placed closest to the second side wall portion among the plurality of light emitting elements; and
a resin portion which is filled into the recess portion so as to cover the first and second light emitting elements and which contains a phosphor for wavelength-converting a part of the light of the second color into a complementary color of the light of the second color so as to emit the wavelength-converted light to an outside;
wherein the resin portion further contains a scattering material for scattering the light of the first color in addition to the phosphor.

2. The semiconductor light emitting device according to claim 1, wherein material of a surface of the first side wall portion differs from material of a surface of the second side wall portion.

3. The semiconductor light emitting device according to claim 2, wherein the material of the surface of the first side wall portion is silver, and the material of the surface of the second side wall portion is a white resin.

4. The semiconductor light emitting device according to claim 1, comprising a base of the first light emitting element which is provided between the first light emitting element and the base portion and which contains gallium arsenide or silicon.

5. The semiconductor light emitting device according to claim 1,
wherein the base portion comprises a support plate that has a groove on a top surface and an outer surrounding body that surrounds side surfaces of the support plate and extending upward from the top surface of the support plate,
wherein the first side wall portion is defined by a side wall of the groove, and the second side wall portion is defined by the outer surrounding body, and
wherein the first and second light emitting elements are placed on the bottom surface of the groove.

6. The semiconductor light emitting device according to claim 5,
wherein the resin portion comprises a first resin portion containing the phosphor and a second resin portion containing the scattering material and is filled into an area surrounded by the outer surrounding body,
wherein the first resin portion covers the first and second light emitting elements, and
wherein the second resin portion covers the first resin portion.

7. The semiconductor light emitting device according to claim 6,
wherein a depth of the groove is larger than heights of the first and second light emitting elements, and
wherein the first resin portion is filled into the groove, and the top surface of the first resin portion is positioned substantially on a same plane as the top surface of the support plate.

8. A semiconductor light emitting device comprising:
a base portion comprising a recess portion that is defined by a pair of opposing first side wall portions, a pair of opposing second side wall portions which extend between the first side wall portions when viewed from above and which are shorter than the first side wall portions, and a bottom surface;
a plurality of light emitting elements which are arranged on the bottom surface of the recess portion in a direction of the first side wall portions when viewed from above and which comprise a first light emitting element for emitting light of a first color and a second light emitting element for emitting light of a second color different from the first color, the second light emitting element being placed closest to the second side wall portion among the plurality of light emitting elements; and
a resin portion which is filled into the recess portion so as to cover the first and second light emitting elements and which contains a phosphor for wavelength-converting a part of the light of the second color into a complementary color of the light of the second color so as to emit the wavelength-converted light to an outside;

wherein a reflectance of a surface of the first side wall portion for the light of the first color is smaller than a reflectance of a surface of the second side wall portion for the light of the first color.

9. A composite light emitting device comprising:

a plurality of semiconductor light emitting devices, each of which comprises:

a base portion comprising a recess portion that is defined by a pair of opposing first side wall portions, a pair of opposing second side wall portions which extend between the first side wall portions when viewed from above and which are shorter than the first side wall portions, and a bottom surface;

a plurality of light emitting elements which are arranged on the bottom surface of the recess portion in a direction of the first side wall portions when viewed from above and which comprise a first light emitting element for emitting light of a first color and a second light emitting element for emitting light of a second color different from the first color, the second light emitting element being placed closest to the second side wall portion among the plurality of light emitting elements; and a resin portion which is filled into the recess portion so as to cover the first and second light emitting elements and which contains a phosphor for wavelength-converting a part of the light of the second color into a complementary color of the light of the second color so as to emit the wavelength-converted light to an outside, wherein the plurality of semiconductor light emitting devices are arranged in the direction of the first side wall portion;

wherein material of a surface of the first side wall portion differs from material of a surface of the second side wall portion.

* * * * *